United States Patent
Hessler et al.

(10) Patent No.: US 8,724,431 B2
(45) Date of Patent: May 13, 2014

(54) FIRST AND SECOND ORDERS TEMPERATURE-COMPENSATED RESONATOR

(75) Inventors: Thierry Hessler, St-Aubin (CH); Silvio Dalla Piazza, St-Imier (CH)

(73) Assignee: The Swatch Group Research and Development Ltd, Marin (CH)

( * ) Notice: Subject to any disclaimer, the term of this patent is extended or adjusted under 35 U.S.C. 154(b) by 335 days.

(21) Appl. No.: 13/156,648

(22) Filed: Jun. 9, 2011

(65) Prior Publication Data

US 2011/0305120 A1   Dec. 15, 2011

(30) Foreign Application Priority Data

Jun. 10, 2010   (EP) .................................... 10165563

(51) Int. Cl.
*G04F 1/04* (2006.01)
(52) U.S. Cl.
USPC .......................................... 368/159; 310/346
(58) Field of Classification Search
USPC .................... 310/346, 370; 368/159
See application file for complete search history.

(56) References Cited

U.S. PATENT DOCUMENTS

| | | | | |
|---|---|---|---|---|
| 3,128,397 A | * | 4/1964 | Oinuma et al. ............... | 310/361 |
| 3,995,240 A | | 11/1976 | Kerbel | |
| 4,320,320 A | * | 3/1982 | Momosaki et al. .......... | 310/361 |
| 5,001,383 A | | 3/1991 | Kawashima | |
| 5,571,363 A | * | 11/1996 | Brosig et al. ................. | 156/292 |
| 6,172,443 B1 | | 1/2001 | Branham | |
| 7,077,562 B2 | * | 7/2006 | Bourgeois et al. ............ | 368/175 |
| 7,327,070 B2 | | 2/2008 | Tanaka | |
| 2005/0184628 A1 | | 8/2005 | Kawashima | |
| 2005/0281137 A1 | | 12/2005 | Bourgeois et al. | |
| 2006/0174818 A1 | * | 8/2006 | Fitzgerald et al. ................ | 117/8 |
| 2011/0305120 A1 | * | 12/2011 | Hessler et al. ................ | 368/159 |

FOREIGN PATENT DOCUMENTS

| | | |
|---|---|---|
| DE | 101 27 733 A1 | 2/2003 |
| EP | 1 422 436 A1 | 5/2004 |
| JP | 50-140288 | 11/1975 |
| JP | 2006-507454 A | 3/2006 |
| WO | 2008/043727 A1 | 4/2008 |

OTHER PUBLICATIONS

Control of Second Order Temperature Coefficient of Saw Propagating in Two Thin Film Layers—1993.*
Fused Quartz—Wikipedia—Jun. 27, 2013.*

(Continued)

*Primary Examiner* — Sean Kayes
(74) *Attorney, Agent, or Firm* — Griffin & Szipl, P.C.

(57) ABSTRACT

A temperature-compensated resonator includes a body used in deformation, wherein the core (58, 58', 18) of the body (3, 5, 7, 15, 23, 25, 27, 33, 35, 37, 43, 45, 47) is formed from a plate formed at a cut angle (θ') in a quartz crystal determining the first and second orders temperature coefficients (α, β, α', β'). According to the invention, the body (3, 5, 7, 15, 23, 25, 27, 33, 35, 37, 43, 45, 47) includes a coating (52, 54, 56, 52', 54', 56', 16) deposited at least partially on the core (58, 58', 18) and having first and second orders Young's modulus variations (CTE1, CTE2, CTE1', CTE2') according to temperature of opposite signs respectively to the first and second orders temperature coefficients (α, β, α', β') of the resonator so as to render compensated first and second orders temperature coefficients substantially zero.

19 Claims, 5 Drawing Sheets

(56) References Cited

OTHER PUBLICATIONS

Melamud R., et al., "Temperature-Insensitive Composite Micromechanical Resonators," Journal of Microelectromechanical Systems, IEEE Service Center, Piscataway, NJ, vol. 18. No. 6, Dec. 1, 2009, pp. 1409-1419.

European Search Report issued in corresponding application 10165563, completed on Dec. 1, 2010.

Letter dated May 7, 2013 reporting office action issued in corresponding Korean application 10-2011-0054031.

Quartz Crystal Glossary of Terms (Ecliptek Corporation), at http://www.ecliptek.com/crystals/faq/TEN12-001-005%20Quartz%20Crystal%20Glossary%20of%20Terms.pdf (downloaded Jul. 22, 2013).

N. Gufflet, Quartz Crystal Resonators—Brief Overview, at http://www.kvg-gmbh.de/assets/files/PDR/IntroductionQuartz.pdf (downloaded Jul. 22, 2013).

Introduction to Quartz Crystals and Natural Quartz, at http://www.us-electronics.com/files/crystals.pdf (downloaded Jul. 22, 2013), which corresponds to Exhibit A.

* cited by examiner

FIRST AND SECOND ORDERS TEMPERATURE-COMPENSATED RESONATOR

This application claims priority from European Patent Application No. 10165563.7 filed Jun. 10, 2010, the entire disclosure of which is incorporated herein by reference.

FIELD OF THE INVENTION

The invention relates to a temperature-compensated resonator of the sprung balance, tuning fork or more generally MEMS type for manufacturing a time base or frequency whose first and second order temperature coefficients are substantially zero.

BACKGROUND OF THE INVENTION

EP Patent No. 1 422 436 discloses a balance spring or a hairspring formed of silicon and coated with silicon dioxide so as to make the temperature coefficient substantially zero around COSC (Contrôle Officiel Suisse des Chronomètres) certification process temperatures, i.e. between +8 and +38° C. Likewise, WO 2008-043727 document discloses a MEMS resonator which has similar properties of low drift from its Young's modulus within the same temperature range.

However, even only the second order frequency drift in the above disclosures can require complex corrections depending upon the application. For example, for electronic quartz watches to be able to be COSC certified, an electronic correction has to be carried out based on a temperature measurement.

SUMMARY OF THE INVENTION

It is an object of the present invention to overcome all or part of the aforementioned drawbacks, by providing a first and second order temperature-compensated quartz resonator.

The invention therefore relates to a temperature-compensated resonator including a body used in deformation, the core of the body being formed from a plate formed at a cut angle ($\theta$) in a quartz crystal that determines the first and second order temperature coefficients, characterized in that the body includes a coating, which is at least partially deposited on the core and has first and second order temperature dependent variations of the Young's modulus of opposite signs respectively to said first and second order temperature coefficients of said resonator so that the latter are rendered substantially zero.

Advantageously according to the invention, the resonator body used in deformation has only one coating to compensate for two orders. Thus, depending upon the size and sign of each order of the coating material, the cut angle in the single crystal quartz and the thickness of the coating are calculated so as to compensate for the first two orders.

In accordance with other advantageous features of the invention:
- the body includes a substantially quadrilateral-shaped section whose faces are in identical pairs;
- the body includes a substantially quadrilateral-shaped section whose faces are entirely coated;
- the cut angle of the plate is selected so that said first and second order temperature coefficients are negative and the coating includes positive first and second order Young's modulus variations;
- the coating includes germanium dioxide;
- the cut angle of the plate is selected so that said first and second order temperature coefficients are respectively positive and negative and the coating has first and second order Young's modulus variations which are respectively negative and positive;
- the coating includes synthetic diamond;
- the body is a bar wound around itself to form a balance spring or a hairspring and is coupled with an inertia block;
- the body includes at least two symmetrically mounted arms forming a tuning fork;
- the tuning fork is of the inverted type and/or grooved type and/or conical type and/or flipper type;
- the body is a MEMS (Micro-Electro-Mechanical System).

Finally, the invention also relates to a time or frequency base, such as, for example a timepiece, characterized in that it includes at least one resonator according to any of the preceding variants.

BRIEF DESCRIPTION OF THE DRAWINGS

Other features and advantages will appear clearly from the following description, given by way of non-limiting indication, with reference to the annexed drawings, in which.

DETAILED DESCRIPTION OF PREFERRED EMBODIMENTS

As explained above, the invention relates to a quartz resonator which may be of the sprung balance or tuning fork type or more generally a MEMS (Micro-Electro-Mechanical System). To simplify explanation of the invention, the only applications presented below are to a sprung balance and tuning forks. However, those skilled in the art could accomplish other resonator applications without any difficulty from the teaching below.

Figure 9:
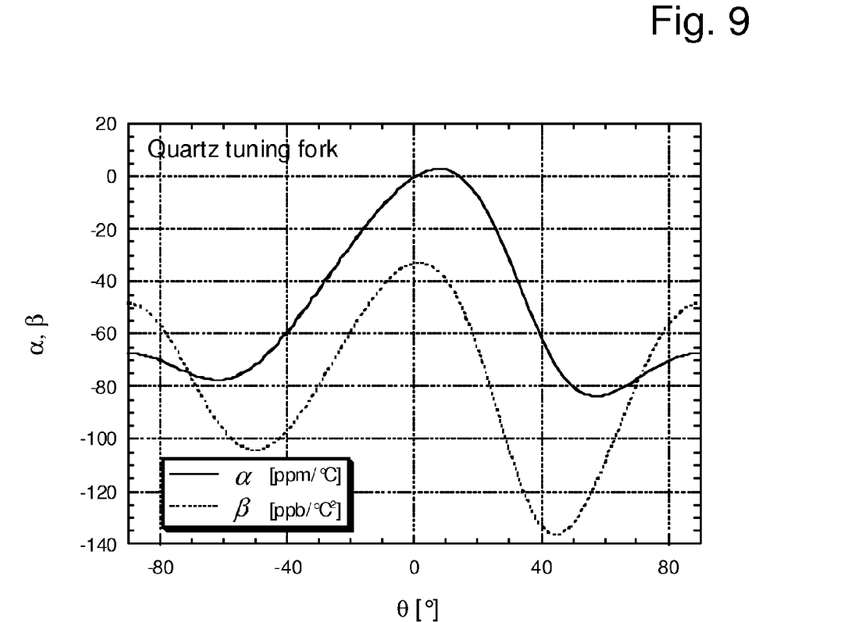
FIG. 9 is a graph showing the first and second order temperature coefficients of a tuning fork according the cut angle thereof in a single crystal quartz.

The graph of FIG. 9 shows the characterization of the first and second order temperature coefficient drift for current tuning fork resonators according to the cut angle along the z axis of a quartz crystal.

Figure 11:
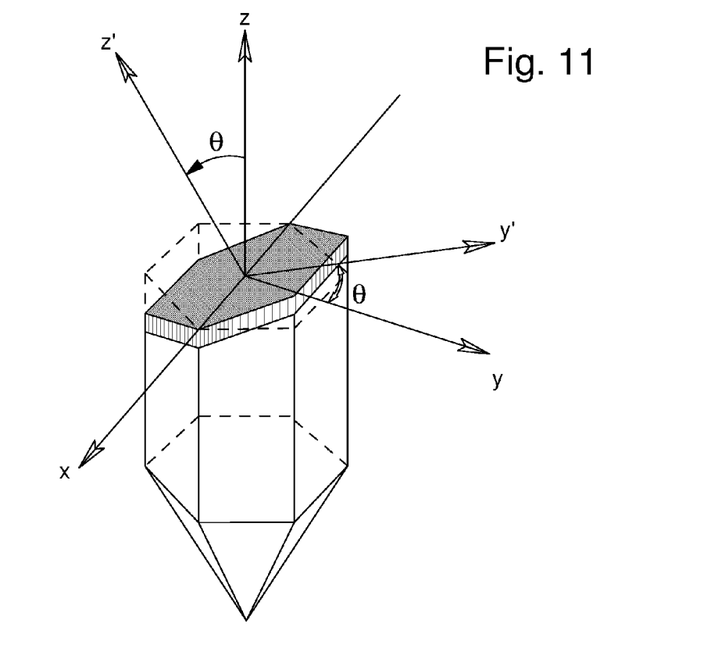
FIGS. 11 and 12 are schematic diagrams of a cut angle relative to the crystallographic axes of a quartz crystal.
Figure 12:
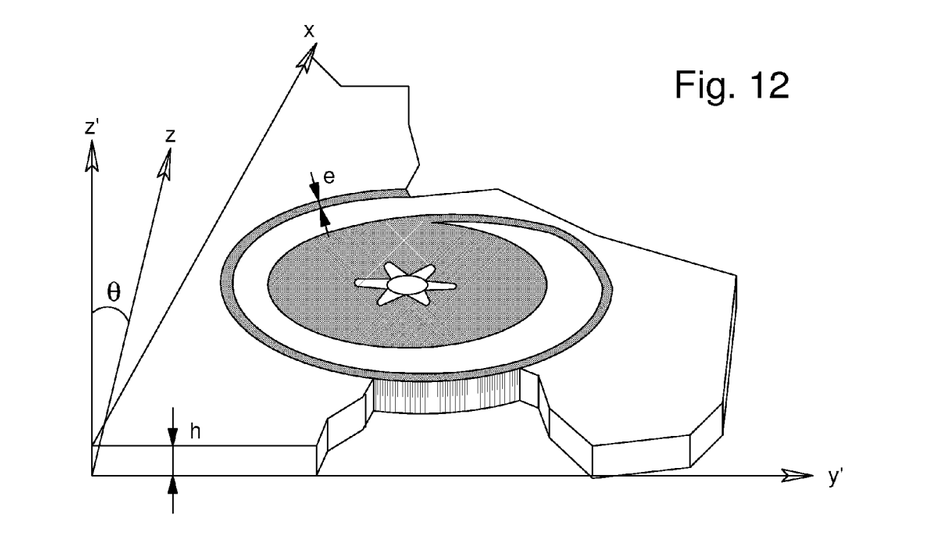

FIGS. 11 and 12 show the spatial interpretation of the z axis relative to a single crystal quartz. A quartz crystal has crystallographic axes x, y, z. The x axis is the electrical axis and the y axis is the mechanical axis. In the example of FIGS. 11 and 12, the height h of the balance spring or tuning fork thus has an orientation relative to crystallographic axis z which depends upon the cut angle $\theta$ that has been chosen.

Of course, cut angle $\theta$ will not be limited to a single angle relative to an axis, since rotations at several angles relative to several axes are also possible to obtain the desired technical effect within the present invention. By way of example, the final cut angle θ could thus be the result of a first angle ϕ relative to the x axis and a second angle ⊖ relative to the z axis.

FIG. 9 shows, as illustrated in a continuous line, that the first order temperature coefficient α intersects the zero axis at around a cut angle of 0 degree and 12 degrees. It is thus clear that, depending upon the cut angle of the single crystal quartz, it is possible to "naturally" obtain a first order temperature coefficient α that is substantially zero, i.e. the resonator has a first order frequency variation that is virtually independent of temperature.

These advantageous features have been used for several decades to form time bases for timepieces with a cut angle of close to 0 degree.

FIG. 9 also shows, as illustrated in dotted lines, that the second order temperature coefficient β never intersects the zero axis. Hence, it is clear that even with the current cut angle close to 0 degrees, the quartz remains sensitive to temperature variations because of variation in the second order temperature coefficient β, but to a lesser degree than with the first order temperature coefficient α.

Finally, in FIG. 9 it can be seen that the negative cut angles in the single crystal quartz systematically form a resonator whose first α and second β orders temperature coefficients are negative.

Advantageously, the idea of the invention is to adapt a quartz cut angle θ with a single layer of coating in order to compensate for the first α and second β orders temperature coefficients of quartz resonators to obtain a resonator that is insensitive to temperature variations.

By way of definition, the relative frequency variation of a resonator follows the relationship below:

$$\frac{\Delta f}{f_0} = A + \alpha \cdot (T - T_0) + \beta \cdot (T - T_0)^2 + \gamma \cdot (T - T_0)^3$$

where:

$$\frac{\Delta f}{f_0}$$

is the relative frequency variation, expressed in ppm ($10^{-6}$);
A is a constant which depends upon the point of reference, in ppm;
$T_0$ is the reference temperature, in ° C.;
α is the first order temperature coefficient, expressed in ppm.° C.$^{-1}$;
β is the second order temperature coefficient expressed in ppm.° C.$^{-2}$;
γ is the third order temperature coefficient, expressed in ppm.° C.$^{-3}$.

Moreover, the thermo-elastical coefficient (CTE) represents the relative variation of the Young's modulus according to temperature. The terms "α" and "β" which are used below thus respectively represent the first and second order temperature coefficients, i.e. the relative frequency variation of the resonator according to temperature. The terms "α" and "β" depend upon the thermo-elastical coefficient of the resonator body and the coefficients of thermal expansion of the body. Moreover, the terms "α" and "β" also take into account the coefficients peculiar to any separate inertia member, such as, for example, the balance for a sprung-balance resonator.

As the oscillations of any resonator intended for a time or frequency base have to be maintained, thermal dependence may also include a contribution from the maintenance system. Preferably, the resonator body is a quartz core coated with a single coating on at least one part or the whole of the external surface thereof, and possibly, on top of the metallizations usually necessary if piezoelectric actuation is desired. Evidently, in this latter case, whichever coating is chosen, the connecting pads must remain free.

The examples illustrated in FIGS. 1 to 4 show tuning fork variants 1, 21, 31, 41 applicable to the invention. They are formed of a base 3, 23, 33, 43 connected to two arms 5, 7, 25, 27, 35, 37, 45, 47 which are intended to oscillate in respective directions B and C.

Figure 2:
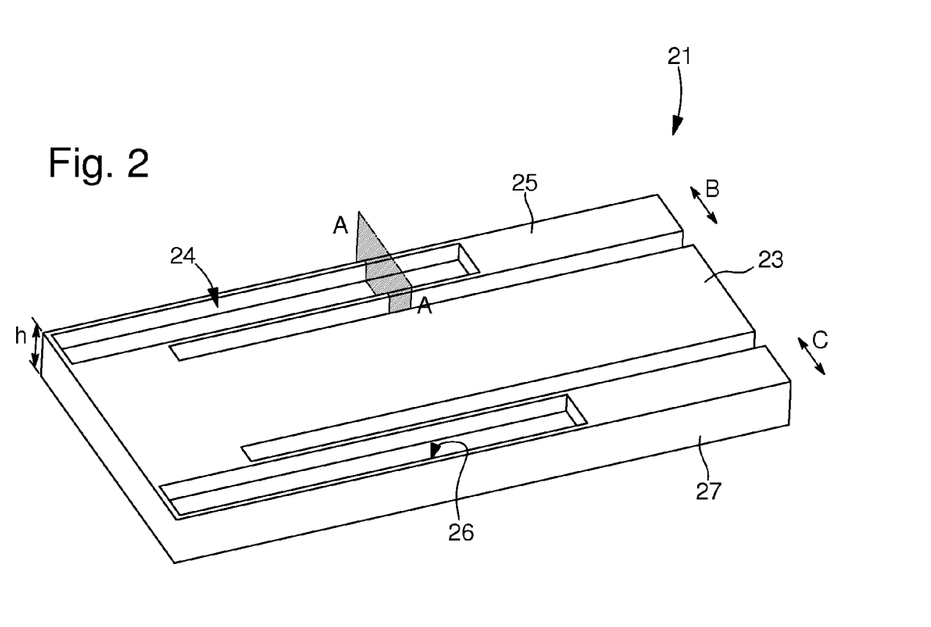
Figure 3:
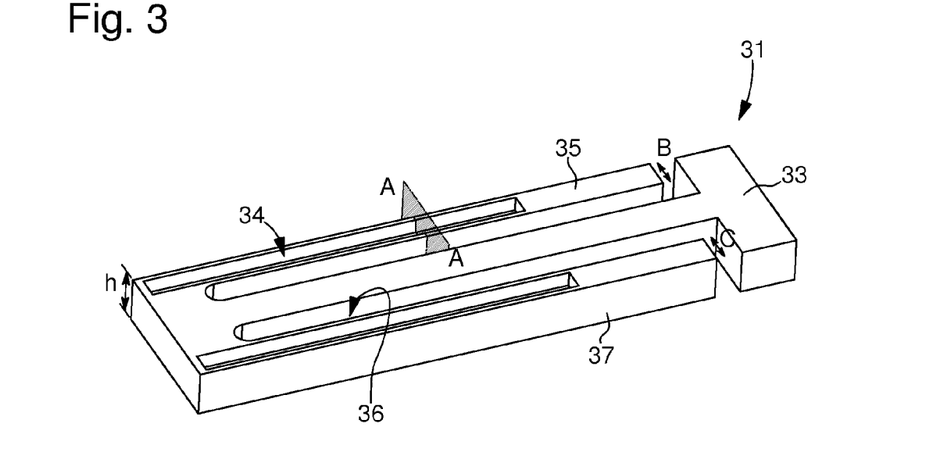
Figure 4:
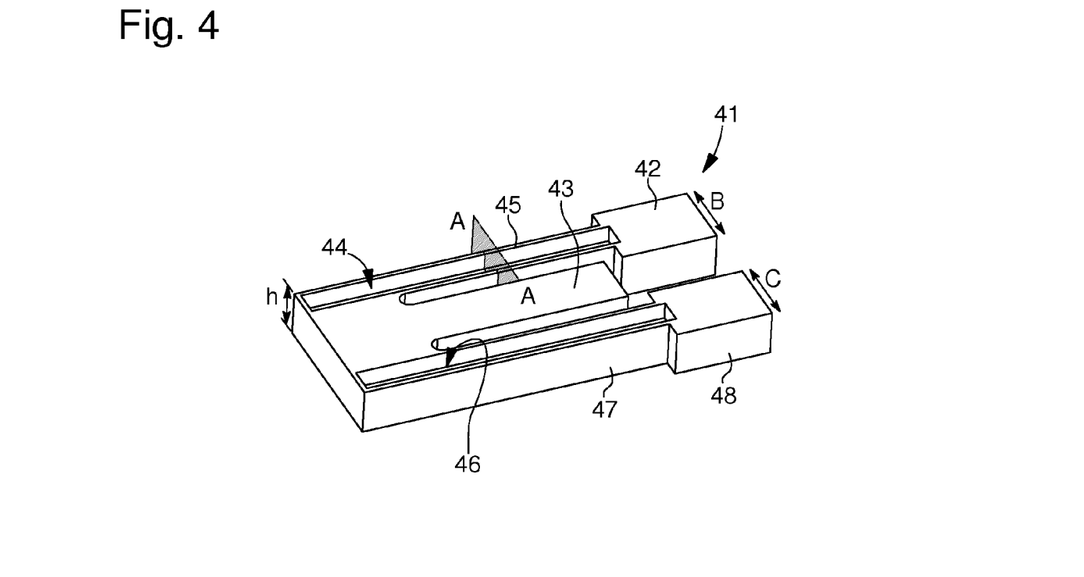

The variants of FIGS. 2 to 4 show inverted type tuning forks 21, 31, 41, i.e. base 23, 33, 43 is extended between the two arms 25, 27, 35, 37, 45, 47 so as to optimise the uncoupling between the fastening and the active area of the resonator 21, 31, 41 and optimise the length of the vibrating arms for a given surface of matter. The variants of FIGS. 2 to 4 show grooved type tuning forks 21, 31, 41, i.e. the two arms 25, 27, 35, 37, 45, 47 include grooves 24, 26, 34, 36, 44, 46 for the deposition of electrodes to increase the piezoelectric coupling and thereby provide resonators of small size with excellent electrical parameters.

Figure 1:
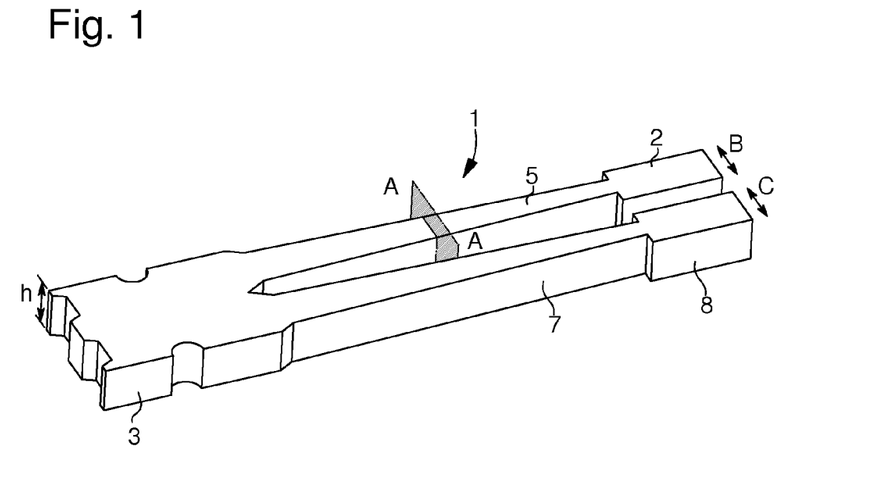
FIGS. 1 to 4 are general perspective diagrams of several types of tuning fork resonators.

Moreover, FIG. 1 shows a conical arm variant 5, 7, i.e. wherein the section gradually decreases away from base 3 so as to distribute the elastic stresses better over the length of the arms and thereby increase the coupling of the electrodes. Finally, FIGS. 1 and 4 show flipper type tuning forks, 1, 41, i.e. both arms 5, 7, 45, 47 include flippes 2, 8, 42, 48 at the end thereof to increase the oscillation inertia of arms 5, 7, 45, 47 of resonator 1, 41, to provide resonators with optimised length for a given frequency. It is thus clear that there is a multitude of possible tuning fork variants which may, in a non exhaustive manner, be of the inverted and/or grooved and/or conical and/or flipper type.

Advantageously according to the invention, each tuning fork 1, 21, 31, 41 includes first α and second β orders temperature coefficients which are compensated for by the deposition of a layer 52, 54, 56, 52', 54', 56' on core 58, 58' of tuning fork 1, 21, 31, 41. FIGS. 5A, 5B, 6A and 6B propose four non-exhaustive cross-section examples of tuning forks 1, 21, 31, 41 along plane A-A which show more clearly the quadrilateral or H-shaped section thereof at least partially coated with a layer 52, 54, 56, 52', 54', 56'. Of course, coatings 52, 54, 56, 52', 54', 56' are not to scale relative to the dimensions of core 58, 58', in order to show more clearly the location of each part 52, 54, 56, 52', 54', 56'.

The study was first carried out for a tuning fork resonator 1 cut in a single crystal quartz along negative angles relative to the z axis, i.e. along negative first α and second β orders temperature coefficients. Materials with positive first and second orders thermo-elastical coefficients CTE1, CTE2 were thus sought. It was discovered that germanium oxide ($GeO_2$), tantalum oxide ($Ta_2O_5$) and stabilised zirconium or hafnium oxides respond to these features.

Analyses were carried out to find a cut angle θ in the quartz with a single layer of coating in order to compensate for the first α and second β order temperature coefficients of quartz resonators. For the case of FIG. 5A, i.e. a coating 52, 54 on each flank of arm 5, 7 of tuning fork 1, the first α and second β orders temperature coefficients of tuning fork resonator 1 were found to converge at an angle θ of −8.408 degrees relative to the z axis and a thickness d of 5.47 μm for each layer 2, 4.

Figure 10:
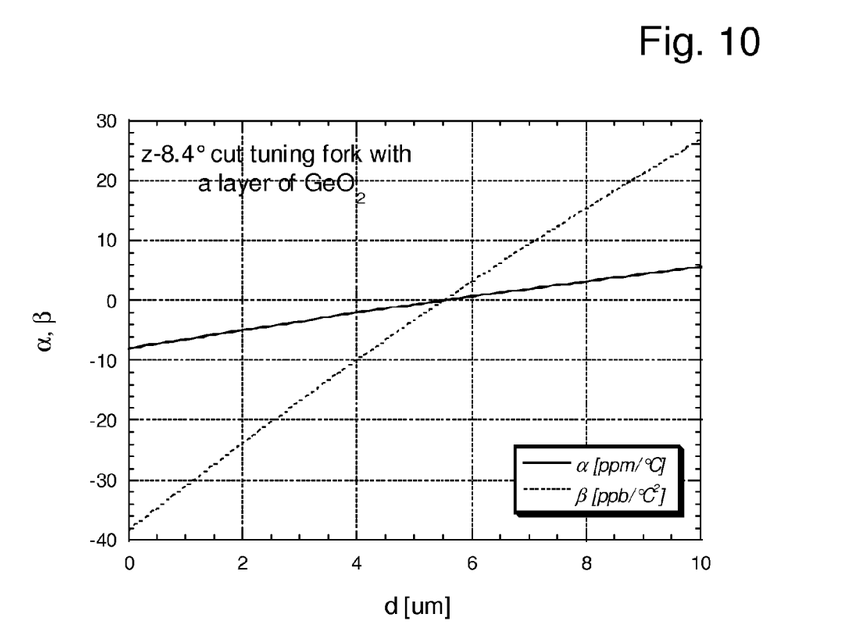
FIG. 10 is a graph showing the first and second order temperature coefficient variations of a quartz tuning fork cut at an angle equal to −8.4° relative to the Z axis according to the thickness of a layer of germanium dioxide.

This convergence is illustrated in FIG. 10 which clearly shows that the first α and second β orders temperature coefficients of tuning fork 1 both intersect the zero axis for a same thickness d of layers 2, 4.

Figure 6A:
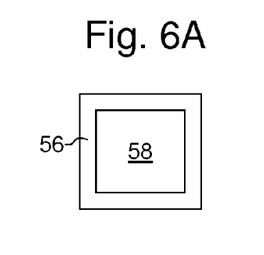

For FIG. 6A, i.e. a coating 56 that completely covers arms 5, 7 of tuning fork 1, the first α and second β orders temperature coefficients of tuning fork resonator 1 were found to converge at an angle θ of −8.416 degrees relative to the z axis and a thickness d of 4.26 μm for layer 6. It is thus concluded that cut angle θ is substantially equivalent to the variant of FIG. 5A, however the necessary thickness d of coating 56 is much smaller.

Figure 5A:
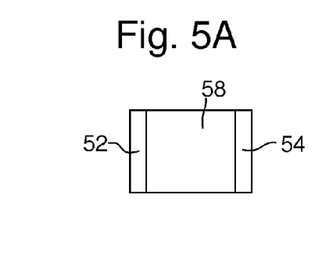
FIGS. 5A, 5B, 6A and 6B are alternatives of the resonator sections of FIGS. 1 to 4.
Figure 5B:
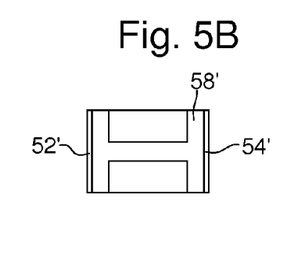
Figure 6B:
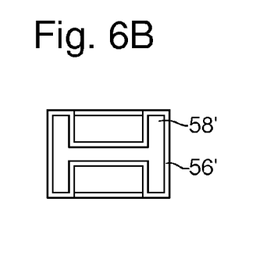

In a similar interpretation for grooved tuning fork sections illustrated in FIGS. 5B and 6B, an angle θ and a thickness d can also be determined. The case of FIG. 6B is particularly advantageous in that coating 56' at the edges of the grooves increases the surface on which the compensation layer is active. It is thus clear, for the particular case of FIG. 6B, that the thickness d of coating 56' will necessarily be even smaller.

It is to be noted that, for all of the above variants, although arms 5, 7, 25, 27, 35, 37, 45, 47 are necessarily coated, base 3, 23, 33, 43 does not necessarily have to be. Indeed, it is at the areas of stress that coating 52, 54, 56, 52', 54', 56' has to be present.

Figure 7:
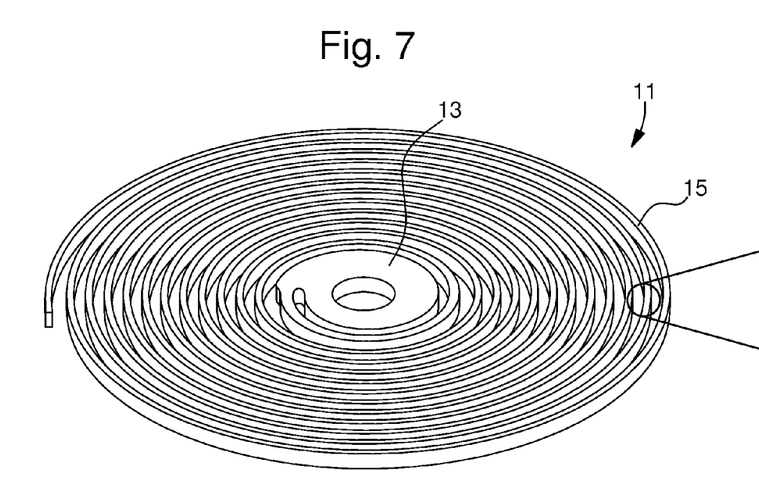
FIG. 7 is a general perspective view of one part of a sprung balance resonator.
Figure 8:
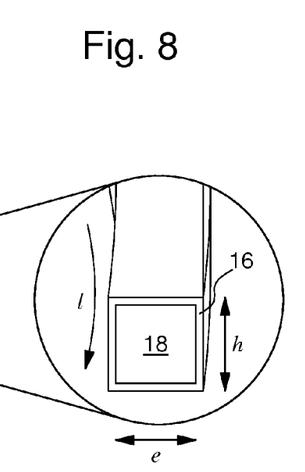
FIG. 8 is a representative section of the balance spring of FIG. 7.

In the example illustrated in FIGS. 7 and 8, a balance spring 11 can be seen whose body 15 is integral with the collet 13 and wherein the first α and second β orders temperature coefficients of the body are compensated. FIG. 8 proposes a cross-section of body 15 of balance spring 11 that shows more clearly the quadrilateral-shaped section thereof. Body 15 can thus be defined by the length l, height h and thickness e thereof. FIG. 8 shows an example where core 18 is entirely coated in a similar manner to FIG. 6A. Of course, FIG. 8 only shows a non-limiting example and, as for tuning forks 1, 21, 31, 41, balance spring 11 may have a coating over at least one part or the entire external surface of body 15.

The study was thus carried out secondly for a sprung balance resonator whose balance spring 11 is cut into a single crystal quartz with negative first α and second β orders temperature coefficients and with coating materials whose first and second orders thermo-elastical coefficients CTE1, CTE2 are positive.

Analyses were carried out to find a cut angle θ in the quartz with a single layer of coating in order to compensate for the first α and second β orders temperature coefficients of quartz resonators.

For the case of FIG. 8, i.e. a coating 16 that totally covers body 15 of balance spring 11, the first α and second β orders temperature coefficients of the resonator were found to converge for several thermal expansion values of the balance:

| $\alpha_{bal}$ | θ | d |
|---|---|---|
| 5 | −15.9 | 8.5 |
| 10 | −12.3 | 7.2 |
| 15 | −8.0 | 6.1 |
| 20 | −2.4 | 5.5 | where:
$\alpha_{bal}$ is the thermal expansion coefficient of the balance expressed in ppm.°C.$^{-1}$;
θ is the cut angle in the quartz, expressed in degrees;
d is the thickness of the GeO$_2$ coating expressed in μm.

Consequently, in light of the above explanations, the teaching of the invention is not limited to a particular coating material, or to a particular resonator or even to a particular deposition area of the coating. The example cut relative to the z axis of the quartz crystal is not limiting either. Other references in the quartz crystal such as the x and y axes are also possible, just as several rotations are possible, as explained above.

It is thus clear that according to the invention it is possible, in an advantageous manner, to compensate for the first α and second β orders temperature coefficients of any quartz resonator with a single layer whose first and second orders thermo-elastical coefficients CTE1, CTE2 are of opposite signs to α and β. It must thus be understood that it is also possible to compensate for the alternative cuts θ' in a single crystal quartz wherein the first α and second β orders temperature coefficients are not negative.

By way of non-limiting example, if alternative first and second order stemperature coefficients α' and β' are respectively positive and negative, it is possible to use an alternative coating whose first and second orders thermo-elastical coefficients CTE1', CTE2' have opposite signs, i.e. respectively negative and positive. This coating may thus be formed from a synthetic diamond which advantageously means that the resonator can be left transparent.

What is claimed is:

1. A temperature-compensated resonator including a body used in deformation, wherein a core of the body is formed from a plate formed at a cut angle in a quartz crystal in order to determine first and second orders temperature coefficients that are respectively positive and negative, wherein the body includes a coating deposited at least partially on the core and having first and second orders Young's modulus variations according to temperature that are respectively negative and positive in order to render the first and second orders temperature coefficients of the resonator substantially zero.

2. The temperature-compensated resonator according to claim 1, wherein the body has a substantially quadrilateral-shaped section with faces in identical pairs.

3. The temperature-compensated resonator according to claim 1, wherein the body includes a substantially quadrilateral-shaped section whose faces are entirely coated.

4. The temperature-compensated resonator according to claim 1, wherein the coating includes synthetic diamond.

5. The temperature-compensated resonator according to claim 1, wherein the body is a bar wound around itself to form a balance spring and is coupled with an inertia member.

6. The temperature-compensated resonator according to claim 1, wherein the body includes at least two symmetrically mounted arms forming a tuning fork.

7. The temperature-compensated resonator according to claim 6, wherein the tuning fork is selected from the group consisting of an inverted type, a grooved type, a conical type, and a flipper type, and combinations thereof 8. The temperature-compensated resonator according to claim 1, wherein the body is a Micro-Electro-Mechanical System.

9. A timepiece that includes at least one temperature-compensated resonator according to claim 1.

10. A temperature-compensated resonator including a body used in deformation, wherein a core of the body is formed from a plate formed at a cut angle in a quartz crystal in order to determine first and second orders temperature coefficients of the resonator that are both negative, wherein the body includes a coating deposited at least partially on the core and having first and second orders Young's modulus variations according to temperature that are respectively both positive in order to render the first and second orders temperature coefficients of the resonator substantially zero.

11. The temperature-compensated resonator according to claim 10, wherein the body has a substantially quadrilateral-shaped section with faces in identical.

12. The temperature-compensated resonator according to claim 10, wherein the body includes a substantially quadrilateral-shaped section whose faces are entirely coated.

13. The temperature-compensated resonator according to claim 10, wherein the body is a bar wound around itself to form a balance spring and is coupled with an inertia member.

14. The temperature-compensated resonator according to claim 10, wherein the body includes at least two symmetrically mounted arms forming a tuning fork.

15. The temperature-compensated resonator according to claim 14, wherein the tuning fork is selected from the group consisting of an inverted type, a grooved type, a conical type, and a flipper type, and combinations thereof.

16. The temperature-compensated resonator according to claim 10, wherein the body is a Micro-Electro-Mechanical System.

17. A timepiece that includes at least one temperature-compensated resonator according to claim 10.

18. The temperature-compensated resonator according to claim 10, wherein the coating includes germanium oxide.

19. The temperature-compensated resonator according to claim 10, wherein the coating includes tantalum oxide.

* * * * *